United States Patent [19]
Petersen

[11] Patent Number: 5,838,168
[45] Date of Patent: Nov. 17, 1998

[54] 3V/5V INPUT BUFFER

[75] Inventor: Larry W. Petersen, Pocatello, Id.

[73] Assignee: American Microsystems, Inc., Pocatello, Id.

[21] Appl. No.: 708,595

[22] Filed: Sep. 5, 1996

[51] Int. Cl.[6] .............................................. H03K 19/092
[52] U.S. Cl. ................................................ 326/81; 327/72
[58] Field of Search .................................. 326/81, 71, 72

[56] References Cited

U.S. PATENT DOCUMENTS

| | | | |
|---|---|---|---|
| 5,117,131 | 5/1992 | Ochi et al. | 326/81 |
| 5,298,807 | 3/1994 | Salmon et al. | 326/81 |
| 5,408,147 | 4/1995 | Yarbrough et al. | 326/81 |
| 5,543,734 | 8/1996 | Volk et al. | 326/81 |
| 5,572,147 | 11/1996 | Huang et al. | 326/81 |
| 5,654,664 | 8/1997 | Park et al. | 326/81 |

*Primary Examiner*—Michael J. Tokar
*Assistant Examiner*—Richard Roseen
*Attorney, Agent, or Firm*—Skjerven, Morrill MacPherson, Franklin & Freil; David E. Steuber

[57] ABSTRACT

An input buffer capable of operating at a first power supply voltage level or a second power supply voltage level with the operating voltage level selectable during manufacture. At least one shortable transistor is disposed between the power supply voltage input and a buffer circuit which is connected between an input and an output of the buffer circuit. When the first voltage is the intended operating voltage the at least one shortable transistor is shorted. The first operating voltage level meets the requirements of a CMOS device and the second operating voltage level meets the requirements of a TTL device. The shortable transistor can be either a p-channel or an n-channel transistor and the short can be done by a metal layer short, a polysilicon short, a depletion implant, or with vias during manufacture. Transistors in the buffer circuit are sized to provide an acceptable TTL device level trip point when the input buffer is operated at 5 volts and which also provides an acceptable CMOS device level trip point when the input buffer is operated at 3 volts. Transistors in the buffer circuit are provided to turn OFF the input buffer at the direction of an external circuit.

28 Claims, 4 Drawing Sheets

5,838,168

3V/5V INPUT BUFFER

BACKGROUND OF THE INVENTION

1. Field of the Invention

This invention relates generally to input buffers for semiconductor integrated circuits and, more specifically, to an input buffer that can be set to operate as either a 3 volt input buffer or a 5 volt input buffer during manufacture.

2. Discussion of the Related Art

The semiconductor industry is a highly innovative industry which requires changes to be implemented in the marketplace as soon as possible after each innovation is made. Success or failure of a company can depend upon the entry into the marketplace on a timely basis while the "window of opportunity" is open. Increasingly, the window of opportunity is open for a very short period of time, and, this can be on the order of months. This means that it is necessary for a company to have "standard" components that can be utilized in a variety of circuits. A standard component is one which does not have to be reengineered each time a function is needed in a different environment, for example, in an environment which operates at a different voltage level.

The semiconductor industry has been characterized by a need to reduce the power requirement of components. This has led to a rapid increase of components that operate at lower voltage levels. Early semiconductor components, such as microprocessors, required a 5 volt or higher power supply. Market demands, such as the demand for "laptop" and "notebook" computers with a requirement for power saving features, have driven the semiconductor manufacturers to produce components that can run at voltages of approximately 3 volts.

However, because components that run at 3 volts have smaller dimensions and more critical processing requirements, it is sometimes required to manufacture systems that run at the higher voltage levels. Because of this, it is advantageous to design standard components that can be utilized in applications that are to be operated at either 5 volts or 3 volts. It is further advantageous for the voltage level at which the component is to be operated to be easily and inexpensively selectable during manufacturing.

There have been attempts to design input buffers that can be operated in a 3 volt environment or a 5 volt environment, but they require several more transistors than conventional buffers and are unduly complex. Prior attempts at providing buffers that can operate at both voltages have had problems because the buffers are nominally designed to operate at 5 volts with an appropriate "trip point" for the 5 volt environment. When the supply voltage is lowered to 3 volts, however, the trip point is proportionally reduced to such an extent that the required input level is reduced to a level that is unacceptably low, causing the circuit to malfunction.

What is needed is an input buffer of simple design that can efficiently and reliably buffer an input voltage level of either 3 volts or 5 volts in a semiconductor device and in which the voltage level at which the buffer will operate is easily selectable during manufacture of the semiconductor device.

SUMMARY OF THE INVENTION

An input buffer according to this invention is capable of operating at a first operating power supply voltage level or a second operating power supply voltage level, with the operating power supply voltage level selectable during manufacture. A buffer circuit including, for example, a CMOS pair is connected between an input and an output of the buffer circuit. At least one transistor that can be electrically isolated from the circuit, such as by shorting, is provided between a power supply voltage input and the buffer circuit.

When the first voltage is the intended operating voltage level the transistor is shorted from the circuit during manufacture. The transistor can be shorted with a metal layer short, a polysilicon layer short, a depletion implant, or by vias.

In the preferred embodiment, the first operating voltage input level meets the requirements of a CMOS device and the second operating voltage input level meets the requirements of a TTL device.

Two transistors in the buffer circuit are sized to provide the appropriate trip point for the buffer circuit when operating at either the first or the second voltage.

At least one transistor in the buffer circuit is provided to turn OFF the buffer circuit when the external circuit is in a power saving mode of operation.

BRIEF DESCRIPTION OF THE DRAWING

The accompanying drawings incorporated in and forming a part of the specification, illustrate the present invention, and together with the detailed description below serve to explain the principles of the invention.

DETAILED DESCRIPTION

Figure 1A:
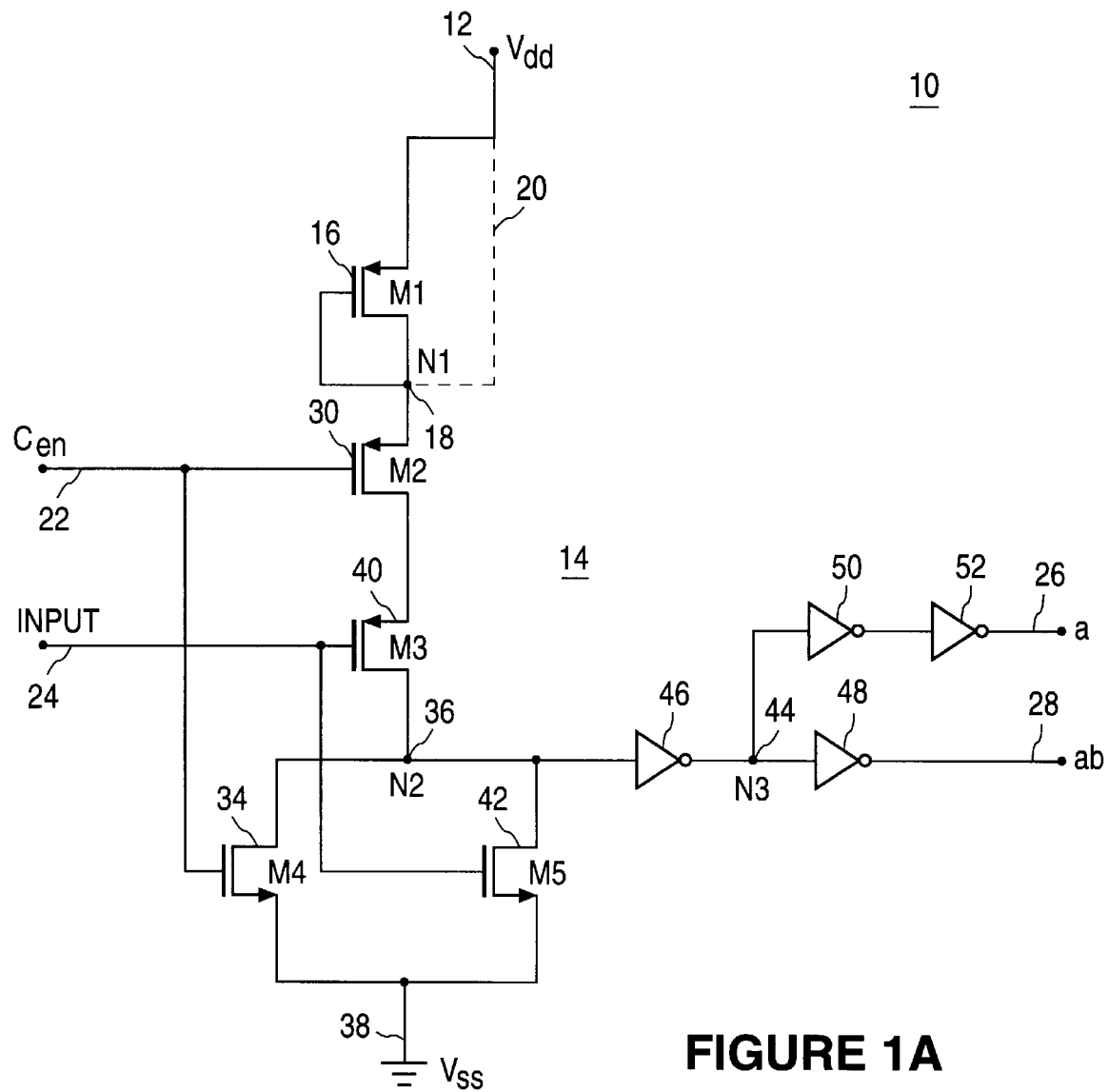
FIG. 1A is a schematic circuit diagram of the input buffer of the present invention having complementary outputs and with a single transistor that can be shorted during manufacture.

In the following description, for purposes of clarity and conciseness of the description, not all of the components shown in the schematic diagrams are described in detail. The components are shown in the drawing to provide a person of ordinary skill in the art a thorough disclosure of the present invention. It will be apparent to one skilled in the art that a detailed description of all of the specific components is not required in order for one of ordinary skill in the art to practice the present invention. Therefore, only those components that are affected by the present invention or that are necessary for an understanding of the present invention will be discussed. In addition, well known electrical structures and circuits are shown in block diagram form in order to not obscure the present invention unnecessarily.

Referring now to FIG. 1A, there is shown a first embodiment of the input buffer 10 of the present invention. The input buffer 10 has a power supply input voltage $V_{dd}$ 12, a buffer circuit, indicated generally at 14, and a single p-channel transistor M1, indicated at 16, connected between input voltage 12 and buffer circuit 14 at node N1, indicated at 18. It should be understood that an n-channel transistor could be utilized in place of the p-channel transistor M1 16. Dashed line 20 represents that transistor M1 16 can be electrically shorted from the buffer circuit 14 during manufacture. The power supply input voltage $V_{dd}$ 12 is typically either 3 volts or 5 volts. When $V_{dd}$ 12 is 3 volts the input voltage levels are referred to as CMOS device voltage levels and when $V_{dd}$ 12 is 5 volts the input voltage levels are referred to as TTL device voltage levels. Buffer circuit 14 has a $C_{en}$ input 22 and an input 24. In this embodiment, there are shown a noninverting output "a" at 26 and an inverting output "ab" at 28. Thus, the embodiment shown in FIG. 1A can be utilized in those applications that require complementary values for any input to the input buffer 14.

The input buffer circuit 14 operates as follows. The $C_{en}$ input 22 is a chip enable input to enable or disable the buffer 14 when a power saving mode is called for by an external circuit (not shown). The $C_{en}$ 22 is connected to the gate of transistor M2 30 which is a p-channel MOSFET and to the gate of transistor M4 34 which is an n-channel MOSFET. When $C_{en}$ 22 is HIGH, transistor M2 30 will be turned OFF and transistor M4 34 will be turned ON, which will pull node N2 36 to ground $V_{ss}$, indicated at 38. Thus, when $C_{en}$ 22 is HIGH, the buffer circuit 14 is shut OFF by transistors M2 32 and M4 34. Alternatively, when $C_{en}$ 22 is LOW, transistor M2 30 will be ON and will allow current to flow from node N1 18 to node N2 36 if transistor M3 40 is ON.

Input 24 is the input pad at which the input signal to be buffered is input. Input 24 is connected to the gate of transistor M3 40 which is a p-channel MOSFET and to the gate of transistor M5 42 which is an n-channel MOSFET. Thus, when the signal at input 24 is HIGH, transistor M3 40 will be OFF and transistor M5 42 will be ON which will pull node N2 36 to ground $V_{ss}$ 38. This will cause the signal at node N3 44 to be HIGH after being inverted by inverter 46 and will cause output "ab" 28 to be LOW after being inverted by inverter 48. Similarily, output "a" at 26 will be HIGH after being inverted twice by inverters 50 and 52. Note that the output "a" at 26 is the mirror of the input at input 24 and output "lab" is the complement of the input at input 24.

When the signal at input 24 is LOW, transistor M3 40 will be ON and transistor MS 42 will be OFF, which will allow node N2 36 to be at substantially the same voltage as node N1 18. In this situation, node N2 36 and node N1 18 are at substantially the same voltage because there is virtually no voltage drop across either transistor M2 30 or transistor M3 40 because both transistors have "zero" volts applied to their gates. In this case, the signal at node N2 36 will be HIGH, the signal at node N3 44 will be LOW, and output "ab" 28 will be HIGH which is the complement of the LOW input signal at input 24. Similarily, the output "a" 26 will be a LOW after the LOW voltage at node N3 44 is inverted twice by inverters 50 and 52.

Transistor M1 16 is disposed between power supply $V_{dd}$ 12 and node N1 18, and dashed line 20 represents that transistor M1 16 can be shorted from the buffer circuit 14. The gate and drain of transistor M1 16 are connected together, so that transistor M1 16 acts as a diode. Transistor M1 16 is sized large enough so that when the circuit is operating at the voltage level of interest, that is, approximately 5 volts, the only voltage drop across it will be its threshold voltage $V_T$, which for a p-channel MOSFET is typically approximately 1 volt. This means that when the transistor M1 16 is connected in the circuit and the voltage $V_{dd}$ is at 5 volts, the voltage at node N1 18 will be approximately 4 volts.

Transistor M3 40 and transistor M5 42 are sized to provide a trip point of 1.4 volts when the transistor M1 16 is in the circuit, $V_{dd}$ 12 is connected to a 5 volt power supply and node N1 18 is at 4 volts. A trip point of 1.4 volts means that a signal at input 24 above 1.4 volts will produce a HIGH at output "a" 26 and alternatively, a signal at input 24 below 1.4 volts will produce a LOW at output "a" 26. To obtain a trip point of 1.4 volts, the relative sizes of transistor M3 40 and transistor M5 42 are adjusted to obtain that trip point. The relative sizes are dependent upon the specific process utilized and can vary from process to process and the specific relative sizes can be easily determined imperically by a person of ordinary skill in the semiconductor processing art. In the present invention, the relative sizes are such that transistor M3 40 is approximately three times the size of transistor M5 42. It is noted that a trip point of 1.4 volts is in accordance with the specifications of a TTL device voltage level requirements.

When the input buffer 14 is to be used as a 3 volt input buffer, transistor M1 16 is shorted from the circuit as indicated by dashed line 20. Transistor M1 16 can be shorted from the circuit by several methods including a metal layer short, a depletion implant, a doped polysilicon layer short, or vias. These methods will be described in more detail below.

When the input buffer 14 is to be used as a 3 volt input buffer, the trip point will now be different than the 1.4 volts that was determined by sizing the transistors M3 40 and M5 42 in the ratio of approximately 3 to 1. When $V_{dd}$ 12 is at 3 volts and transistor M1 16 is shorted, the voltage at node N1 18 is also 3 volts. This compares with 4 volts, which as noted above is the voltage at node N1 18 when $V_{dd}$ is at 5 volts and transistor M1 16 is connected into the circuit between $V_{dd}$ 12 and node N1 18. It has been found that reducing the voltage at node N1 18 from 4 volts to 3 volts causes the trip point to drop from 1.4 volts to approximately 1.2 volts. A trip point of approximately 1.2 volts is satisfactory for the CMOS device voltage level requirements.

The inverters 46, 48, 50, and 52 also serve to "buffer up" the signal so that the signal will be able to "power" the several circuits that typically the signal will be input to in the external circuit (not shown).

Figure 1B:
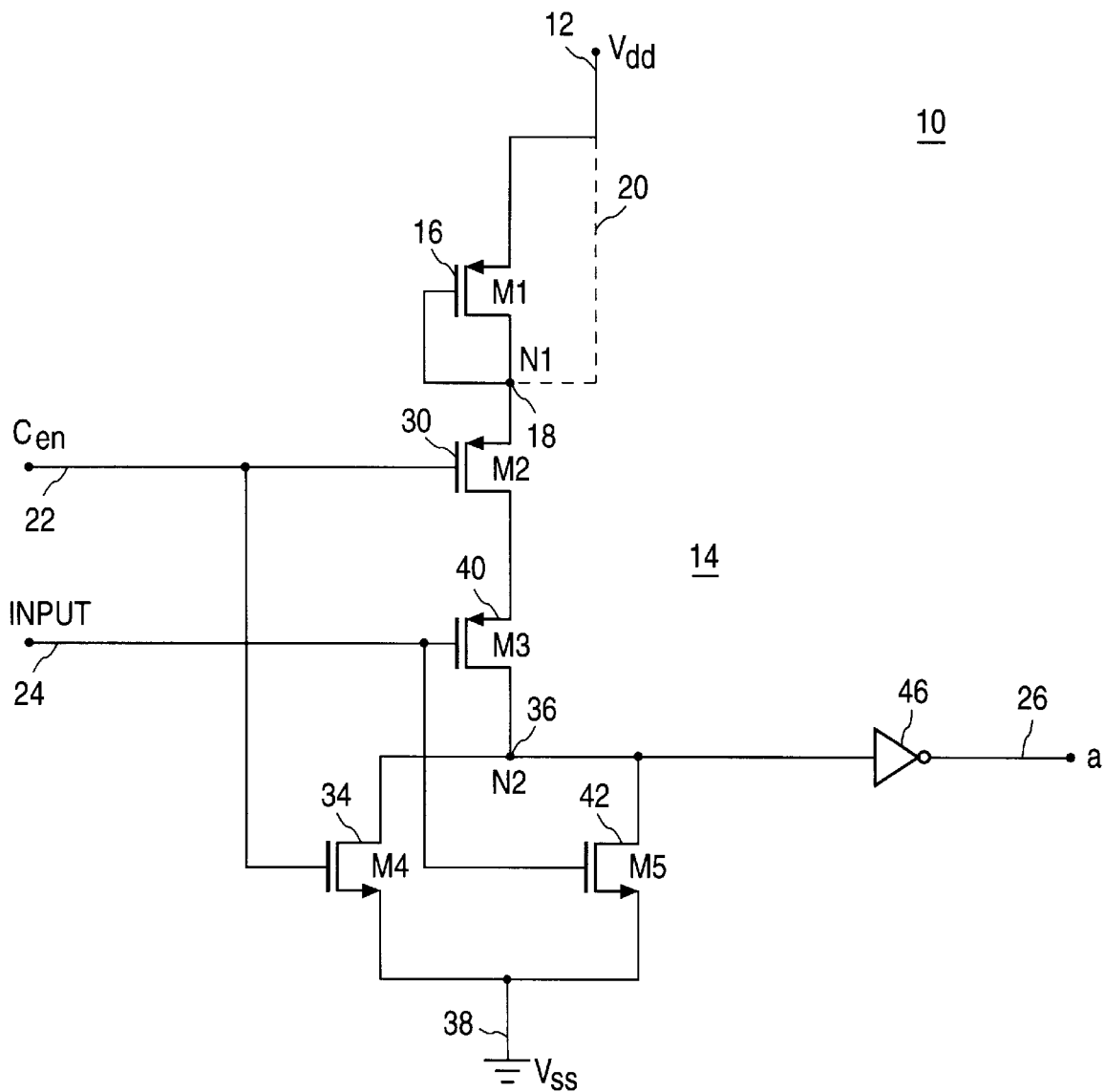
FIG. 1B is a schematic circuit diagram of the input buffer of the present invention having a single output and with a single transistor that can be shorted during manufacture.

Referring now to FIG. 1B, there is shown an embodiment of the present invention in which the output "a" is in effect taken at node N3 44 in FIG. 1A. The output "a" 26 in the embodiment of FIG. 1B is noninverting, that is, the output at 26 will be a mirror of the input at 24. Like numerals are used for like elements in FIG. 1B and FIG. 1A. The buffer circuit 14 in this configuration is utilized in those applications in which a complementary output is not required.

Figure 2:
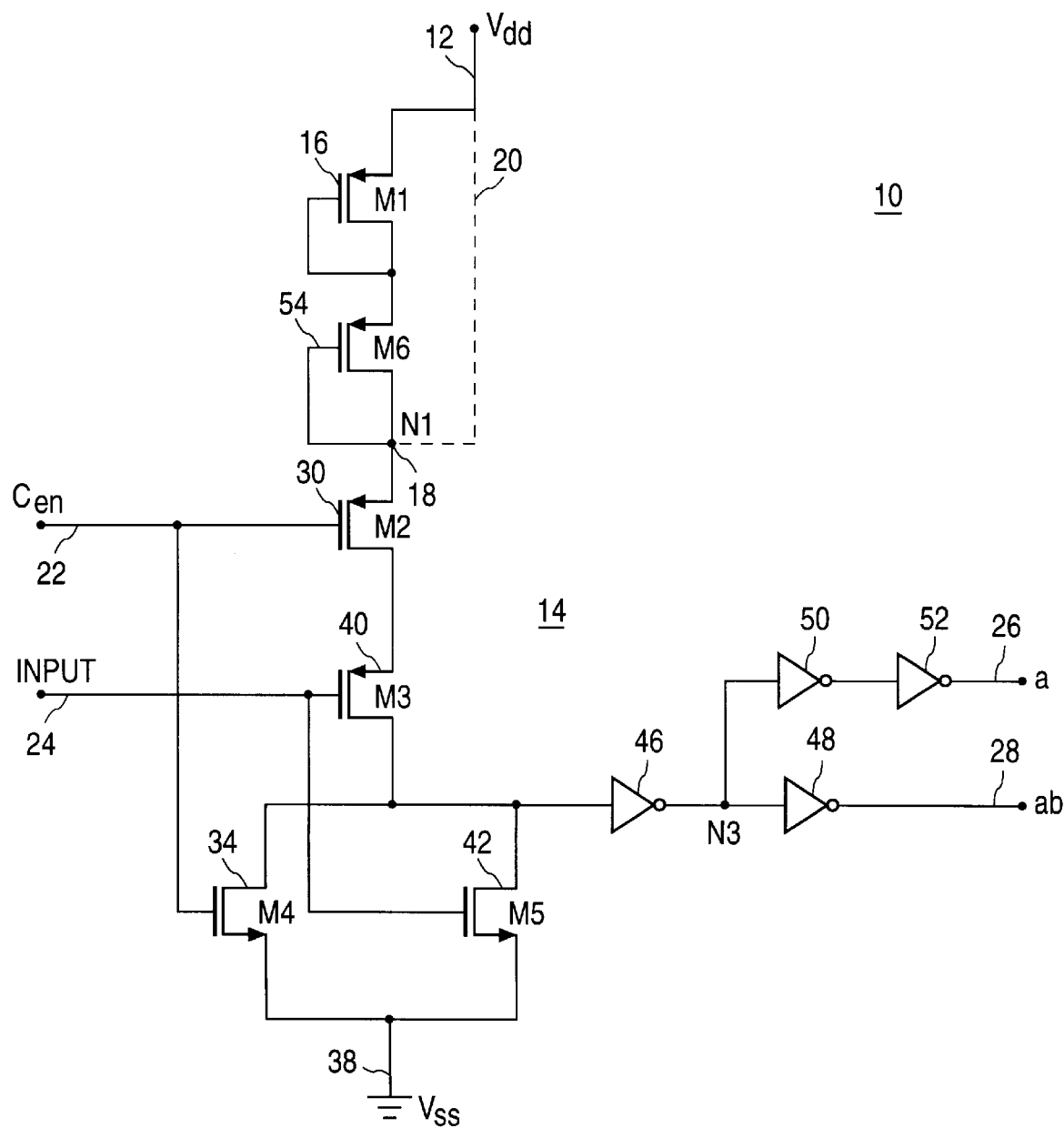
FIG. 2 is a schematic circuit diagram of the present invention with two transistors that can be shorted during manufacture.

Referring now to FIG. 2 there is shown an embodiment of the present invention in which there are two transistors, M1 16 and M6 54 that can be shorted from the input buffer circuit 14 when it is desired to operate the input buffer 14 at 3 volts. It is noted that like numerals are used for like elements in FIG. 2 as are used in FIGS. 1A or 1B. Transistor M6 54 is connected with its drain connected to its gate so it acts like a diode and it is also sized so that the voltage drop across it will be approximately 1 volt when operated in the voltage environment of interest, that is, approximately 5 volts. With two transistors M1 16 and M6 54 that can be shortened and if they are sized as described above in the discussion relating to FIG. 1A, each of the transistors will have approximately a 1 volt drop since each transistor has its drain connected to its gate. This means that a voltage of approximately 3 volts will be at node N1 18 when the input voltage $V_{dd}$ is at 5 volts. Therefore, the sizing of transistors M3 40 and M5 42 is much less critical, and when sized to provide a trip point of 1.4 volts for the TTL device voltage level requirements (when V$_{dd}$ 12 is at 5 volts) the trip point would remain the same when the voltage input V$_{dd}$ is 3 volts. A possible drawback to this is that the extra transistor M6 54 takes up space on the chip. Moreover, in some instances because of process variations during manufacturing, the voltage drop across each of transistors M1 16 and M6 54 may exceed 1 volt which would make the voltage at node N1 18 too low for proper operation.

Figure 3A:
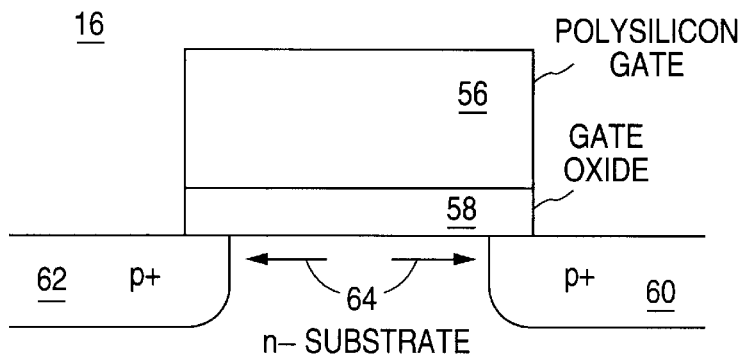
FIGS. 3A & 3B show a conventional field effect transistor in a normal configuration.

Referring now to FIG. 3A there is shown a cross-sectional representation of transistor M1 16. The transistor M1 16 is a typical p-channel MOSFET with a polysilicon gate 56, a gate oxide layer 58, and a p+ drain region 60 and a p+ source region 62. The channel region is indicated at 64.

Figure 3B:
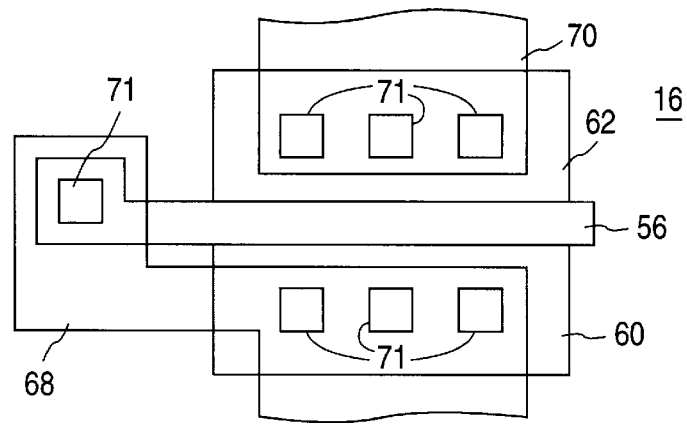

Referring now to FIG. 3B there is shown a top-sectional representation of transistor M1 16. The polysilicon gate is indicated at 56, the source region is indicated at 62, the drain region is indicated at 60 and the structure at 68 indicates that the drain is connected to the gate. The structure indicated at 70 is an electrical connection, connecting the source electrically to the voltage supply V$_{dd}$ and is typically a metal. Similarly, the structure at 68 is a typically a metal layer connecting the drain electrically to node N1 18. Structures indicated at 71 are vias connecting structures in one layer to structures in a different layer and are typically metal, however, other materials can be used such as highly doped polysilicon.

Figure 4A:
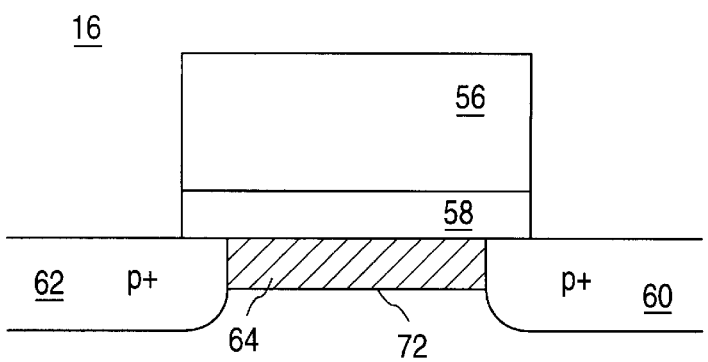
FIGS. 4A & 4B show cross-sectional and plan views, respectively, of the transistor shown in FIGS. 3A & 3B, with a depletion implant to electrically short the transistor from the circuit.

Referring now to FIG. 4A there is shown the transistor M1 16 with a p-type depletion implant, indicated at 72, which is implanted in the channel region 64. The depletion implant provides a channel with virtually zero resistance, that is, a virtual short between the source region 62 and the drain region 60. The depletion implant can be done at various times in the manufacturing sequence. In some cases it may be be done through the gate oxide or through the gate oxide and the polysilicon gate. In other cases it may be done be before the gate oxide is formed. The doping concentration is chosen to be sufficient to create a depletion device such that it would be on at a gate-source voltage of zero volts. It is noted that like numerals denote like components between FIGS. 3A, 3B, 4A, and 4B.

Figure 4B:
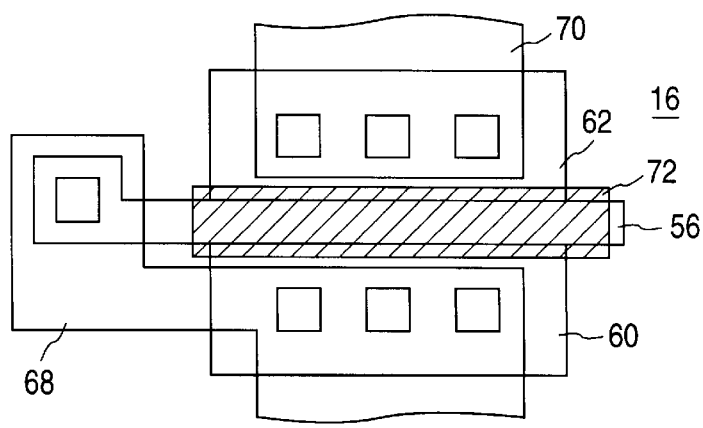

Referring now to FIG. 4B there is shown a top-sectional representation of transistor M1 16. The depletion implant area is indicated at 72.

Figure 5:
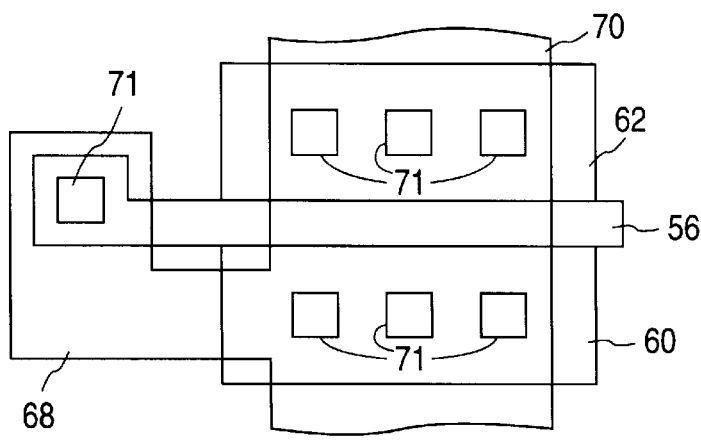
FIG. 5 shows the transistor shown in FIGS. 3A & 3B with a metal layer short to electrically short it from the circuit.

Referring now to FIG. 5 there is shown transistor M1 16 unshorted, as it would be when it is a part of the circuit. FIG. 5 is a top-sectional representation of transistor M1 16 with the drain shorted to the source. The short is achieved by connecting the metal layer 70 to the metal layer 68.

It will be understood that the techniques described above and illustrated in FIGS. 4A, 4B, and 5 may also be used to isolate transistors M6 54 in the embodiment of FIG. 2. Moreover, it should be understood that other methods, well known in the art, could be used to short or short the transistor M1 16 and transistor M6 54. Such other methods include a doped polysilicon layer, used in place of the metal layer described above, and appropriately placed vias.

The foregoing description of the preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What I claim is:

1. An input buffer capable of operating at a first supply voltage or a second supply voltage with the operating voltage level selectable during manufacture, comprising:

a power supply voltage input terminal;

a buffer circuit connected between a signal input terminal and a signal output terminal; and at least one transistor connected between the power supply voltage input terminal and the buffer circuit, wherein a direct electrical connection is formed between the source and drain terminals of at least one of said transistor so as to short the at least one transistor when the first supply voltage is the intended operating voltage.

2. The input buffer of claim 1, wherein said buffer circuit further comprises:

a first transistor; and a second transistor wherein said first transistor and said second transistor are sized to provide a trip point appropriate for use at the second supply voltage, said first and said second transistors being connected in a series conduction path, a first node in said series conduction path between said first and said second transistors being connected to said signal output terminal.

3. The input buffer of claim 2, wherein said second supply voltage is the TTL device voltage level and the trip point is the trip point appropriate for the TTL device voltage level requirement.

4. The input buffer of claim 3, wherein said second supply voltage is approximately 5 volts.

5. The input buffer of claim 4, wherein said trip point is approximately 1.4 volts.

6. The input buffer of claim 2, wherein said first supply voltage is the CMOS device voltage level.

7. The input buffer of claim 6, wherein said first supply voltage is approximately 3 volts.

8. The input buffer of claim 7, wherein the trip point changes when the operating voltage changes from the second supply voltage to the first supply voltage.

9. The input buffer of claim 8, wherein the changed trip point is appropriate for the CMOS device voltage level requirements.

10. The input buffer of claim 9, wherein the changed trip point is approximately 1.2 volts.

11. The input buffer of claim 1, wherein the at least one transistor is shorted with a metal layer.

12. The input buffer of claim 1, wherein the at least one transistor is shorted with a depletion implant.

13. The input buffer of claim 2, wherein said buffer circuit further comprises third and fourth transistors to turn OFF the input buffer, said third transistor being connected in said series conduction path, said fourth transistor is connected in parallel with said second transistor the control terminals of said third and said fourth transistors being connected to a chip enable signal terminal.

14. The input buffer of claim 2, wherein the control terminals of said first and said second transistors are connected to said signal input terminal.

15. A method of manufacturing an input buffer unit capable of operating at a first supply voltage or a second supply voltage, the first supply voltage being lower than the second supply voltage, the operating voltage level at which the input buffer unit is to operate being selectable during manufacture, the method comprising the steps of:

provide a buffer circuit, the buffer circuit having a signal input terminal, a signal output terminal, and a power terminal;

connecting the at least one transistor between the power terminal of the buffer circuit and a power supply voltage input terminal of the buffer unit;

determining whether the buffer unit is to operate at the first supply voltage or the second supply voltage; and forming a direct electrical connection across at least one transistor so as to short the at least one transistor, if the buffer unit is to operate at the first supply voltage.

16. The method of claim 15, further comprising the step of providing a first transistor and a second transistor, said first and said second transistors being connected in a series conduction path, a first node in said series conduction path between said first and said second transistors being connected to said signal output terminal, wherein said first and said second transistors are sized to provide a trip point appropriate for use at the second supply voltage.

17. The input buffer of claim 16, wherein the control terminals of said first and said second transistors are connected to said signal input terminal.

18. The method of claim 16, wherein said second voltage is the TTL device voltage level and the trip point is the trip point appropriate for the TTL device voltage level requirement.

19. The method of claim 18, wherein said second supply voltage is approximately 5 volts.

20. The method of claim 19, wherein said trip point is approximately 1.4 volts.

21. The method of claim 16, wherein said first supply voltage is the CMOS device voltage level.

22. The input buffer of claim 21, wherein said first supply voltage is approximately 3 volts.

23. The method of claim 19, wherein the trip point changes when the operating voltage is changed from the second supply voltage to the first supply voltage.

24. The method of claim 20, wherein the changed trip point is appropriate for the CMOS device voltage level requirements.

25. The method of claim 24, wherein the changed trip point is approximately 1.2 volts.

26. The method of claim 15, further comprising the step of shorting the at least one transistor with a metal layer.

27. The method of claim 15, further comprising the step of shorting the at least one transistor with a depletion implant.

28. The method of claim 16, further comprising the step of providing third and fourth transistors to turn OFF the input buffer, said third transistor being connected in said series conduction path, said fourth transistor is connected in parallel with said second transistor the control terminals of said third and said fourth transistors being connected to a chip enable signal terminal.

* * * * *